United States Patent
Nakamura

[11] Patent Number: 6,076,680
[45] Date of Patent: Jun. 20, 2000

[54] TAPED ELECTRONIC COMPONENTS

[75] Inventor: Satoshi Nakamura, Kyoto, Japan

[73] Assignee: Rohm Co., Ltd., Kyoto, Japan

[21] Appl. No.: 08/036,249

[22] Filed: Mar. 24, 1993

[30] Foreign Application Priority Data

Mar. 31, 1992 [JP] Japan ................................ 4-078036

[51] Int. Cl.$^7$ .................................................. B65D 85/30
[52] U.S. Cl. ................................................ 206/713; 206/726
[58] Field of Search .................................... 439/571, 572,
439/573, 560, 885, 590, 693, 937; 206/328,
330, 331

[56] References Cited

U.S. PATENT DOCUMENTS

| 4,223,786 | 9/1980 | Hori ........................................... 206/330 |
| 4,796,158 | 1/1989 | Sim ......................................... 206/331 X |
| 5,041,349 | 8/1991 | Becker et al. ......................... 206/331 X |
| 5,141,450 | 8/1992 | Kikuchi et al. ....................... 206/330 X |

FOREIGN PATENT DOCUMENTS

| 0212369 | 9/1991 | Japan . |
| 4102575 | 4/1992 | Japan . |
| 2170469 | 8/1986 | United Kingdom . |

OTHER PUBLICATIONS

Rohm Electronic Components & Devices Catalog, p. 61, issued Oct., 1992.

*Primary Examiner*—Jacob K. Ackun
*Attorney, Agent, or Firm*—Dickstein Shapiro Morin & Oshinsky LLP

[57] ABSTRACT

This invention provides taped electronic components and a method of taping electronic components which can be used when a plurality of components are to be automatically mounted by an automatic mounting device. Sideways motion and twisting of the components are thereby prevented, and a plurality of components can be accurately positioned at predetermined intervals by taping leads in position. Leads on both edges of these components are arranged to be longer than other leads, and these longer leads are held in position by a tape. Further, after forming the leads and tie-bars in a one-piece construction when the leads are formed, the inner leads are cut short and the tie-bars are held in position with tape.

4 Claims, 4 Drawing Sheets

TAPED ELECTRONIC COMPONENTS

BACKGROUND OF THE INVENTION

1. Field of the Invention

This invention relates to a method of taping electronic components when such components are to be automatically mounted. It also refers to taped electronic components, and in particular to the taping of hybrid ICs, network resistors and single in-line type electronic components.

2. Description of the Related Art

A method is known in the art wherein electronic components are automatically mounted on a printed board by means of an automatic mounting device known as a mounter or an insertion machine. In this process, a plurality of electronic components are taped, and the taped components are then sent to the automatic mounting device.

Conventionally, when taping in-line type electronic components and in particular hybrid ICs, a plurality of leads are attached to the components and the inner leads are then taped together.

In other words, after attaching a plurality of leads formed in a one-piece construction on a frame to a hybrid IC, as shown in FIG. 1, the outer leads a and c are cut short so that the inner leads b are longer, and these longer leads b are then taped by means of tape 3 so that a plurality of hybrid ICs 1, 2 can be positioned at predetermined intervals.

However, single in-line type electronic components are heavy, and if the inner leads are fixed with tape, the components tend to move from side to side or become twisted. Moreover, each individual component was held in position by cutting leads from a frame, attaching them to the components and then taping the leads together. This led to an error in positioning so that the component could not be grasped by the mounting device, and as the component also touched various parts of the device, it could not be accurately mounted on a printed board.

SUMMARY OF THE INVENTION

This invention therefore aims to provide electronic components taped in such a way that there is no risk of the component moving from side to side or twisting so that a plurality of components can be accurately fixed at predetermined intervals, and to provide a method of taping electronic components in this way.

The taped electronic components of this invention are characterized in that a plurality of components are attached to a plurality of lead groups held in position by arranging one or more lead groups on both edges of each component to be longer than the other lead groups, and taping these longer lead groups together. They are alternatively characterized in that a plurality of components are attached to a lead frame, comprising tie-bars and a plurality of lead groups, via these lead groups, the inner lead groups on the components being cut short, and the tie-bars being taped together.

The taping method of this invention is characterized in that, when a plurality of electronic components are to be automatically mounted by means of an automatic mounting device and a plurality of lead groups attached to the components are held in position by taping, one or more lead groups on both edges of each component are arranged to be longer than the other lead groups, and these longer lead groups are taped together. It is alternatively characterized in that, when a plurality of electronic components are to be automatically mounted by means of an automatic mounting device and a plurality of lead groups attached to the components are held in position by taping them together, a lead frame is formed from tie-bars and these lead groups, and after attaching the lead groups to the components, the inner lead groups are cut short and the tie-bars are taped together.

In the case of the taped electronic components of this invention, one or more lead groups on each component are arranged to be longer than the other lead groups, and the longer lead groups are taped together. In the method of taping electronic components of this invention, one or more lead groups on both edges of each component are arranged to be longer than the other lead groups, and these longer lead groups are taped in position. Sideways motion and twisting of components is therefore prevented.

Alternatively, in the case of taped components wherein the tie-bars of a lead frame comprising lead groups and tie-bars are held in position by tape, and in the method wherein a lead frame is formed from a plurality of lead groups and tie-bars and the tie-bars are taped, support strength is increased and the interval between lead groups can be accurately set when the frame is formed. The interval between electronic components can therefore be maintained at a very high precision, and positioning errors can be prevented.

DESCRIPTION OF THE PREFERRED EMBODIMENTS

The invention will now be described in more detail with reference to the attached drawings.

Figure 2:
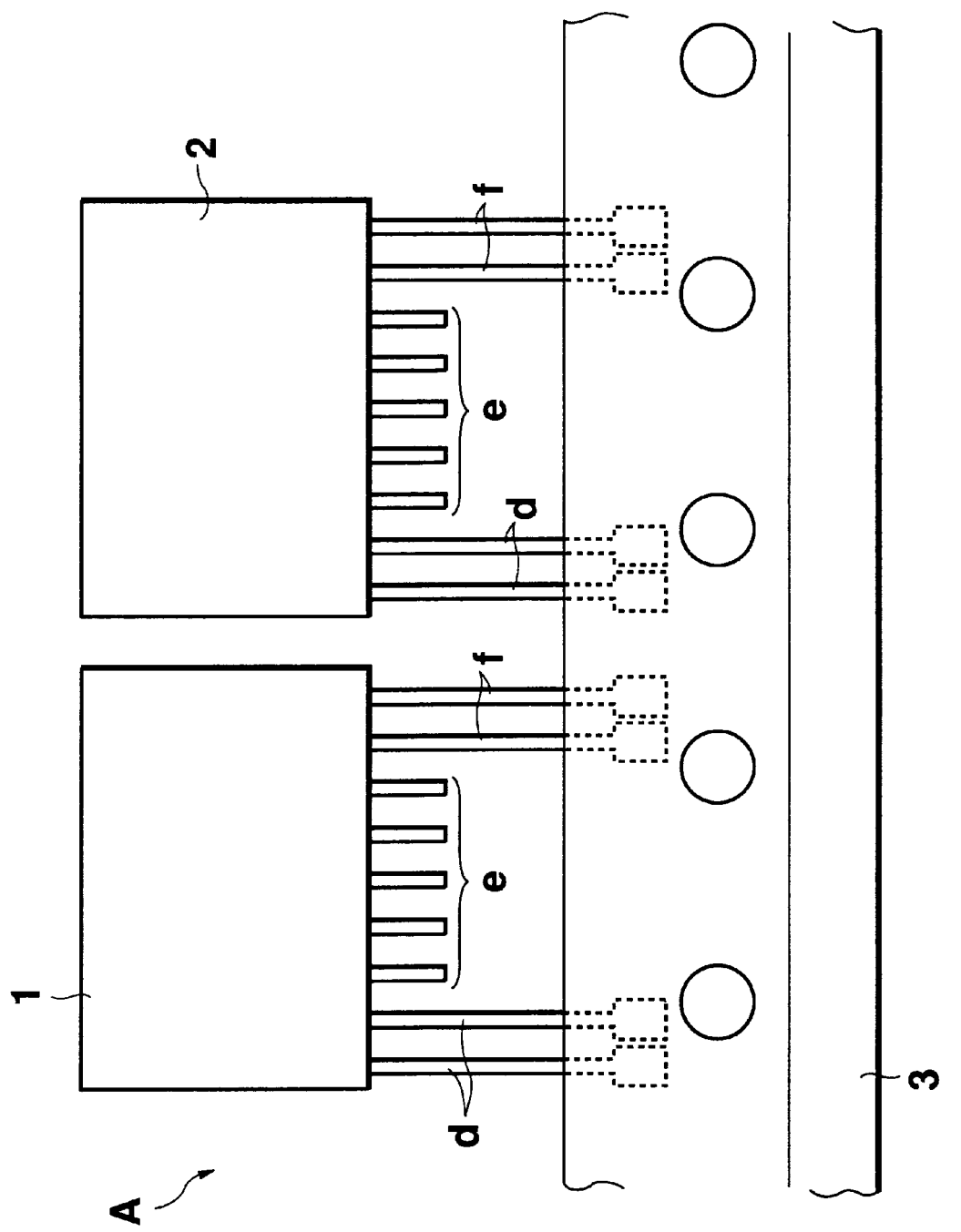
FIG. 2 is a view in profile showing taped electronic components and a taping method according to the present invention.

As shown in FIG. 2, in a taped electronic component A according to this invention, leads d–f attached to the hybrid ICs 1 and 2 are held in position by taping with a tape 3. It is a characteristic feature of this invention that the leads d and f on the edges of the hybrid ICs 1, 2 are arranged to be longer than the inner leads e, and these longer leads d and f are taped.

Figure 1:
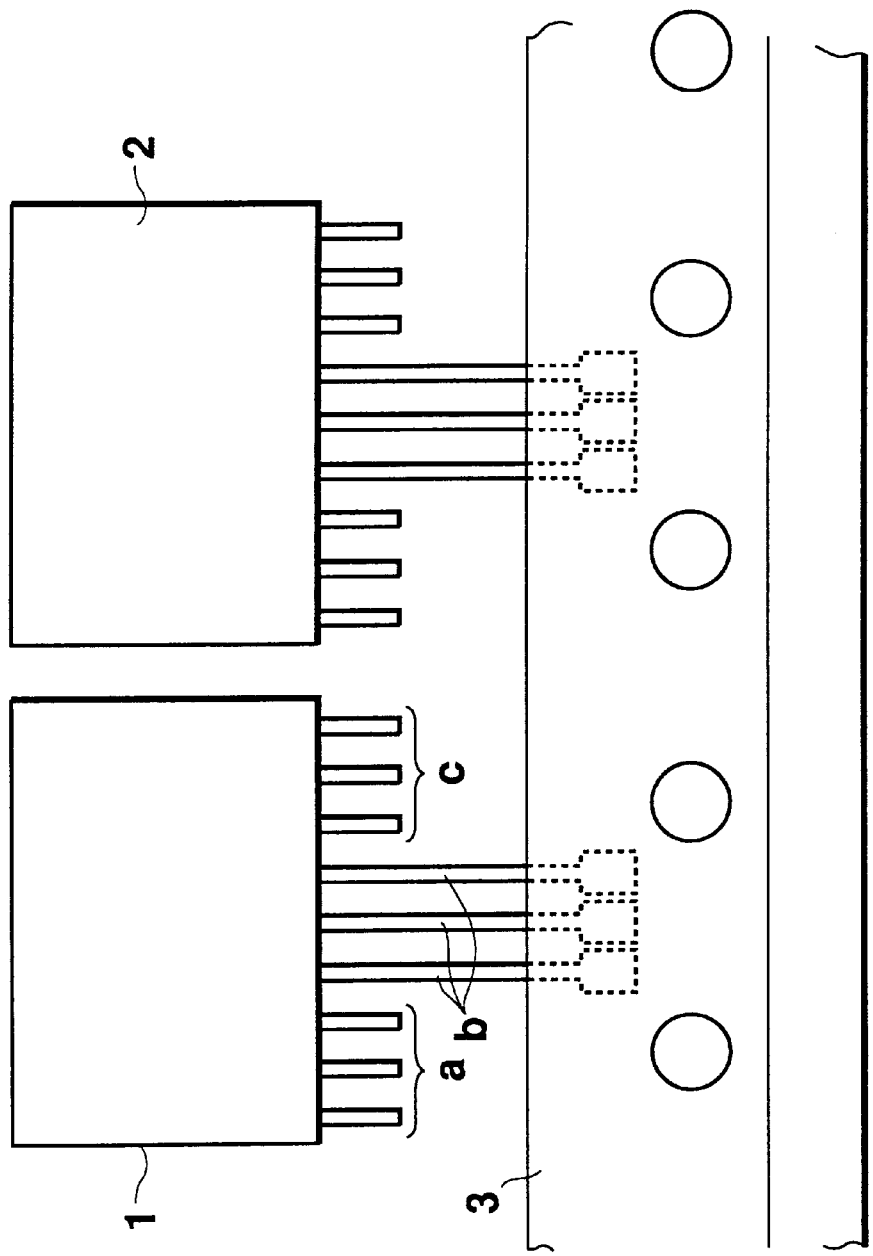
FIG. 1 is a view in profile showing taped electronic components and taping method of the related art.

The taping of the aforesaid electronic component A is carried out by the following method. Leads formed in a one piece construction with belt-shaped tie-bars are attached by soldering to a hybrid IC, and are cut as shown by d, e, f in FIG. 1. The leads d, f form a rectangular part of the tie-bars, and the other leads e are cut shorter. The longer leads d, f on both edges of the IC are then taped in position by the tape 3. The IC 2 adjacent to IC 1 is taped in position in the same manner as that just described, and other hybrid ICs, not shown, are interposed in a similar manner.

A plurality of hybrid ICs are thereby fixed in position by tape, and these taped IC are then sent to a mounter for automatic mounting on a printed board. The mounter cuts the longer leads d, f to the same length as the shorter leads e, and a hybrid IC having leads of the same length is thereby mounted on the printed board.

According to the taped components and taping method of this example, the hybrid IC are supported by leads on both edges. There is therefore no offset, and insertion by the mounter is both easy and accurate.

Figure 3:
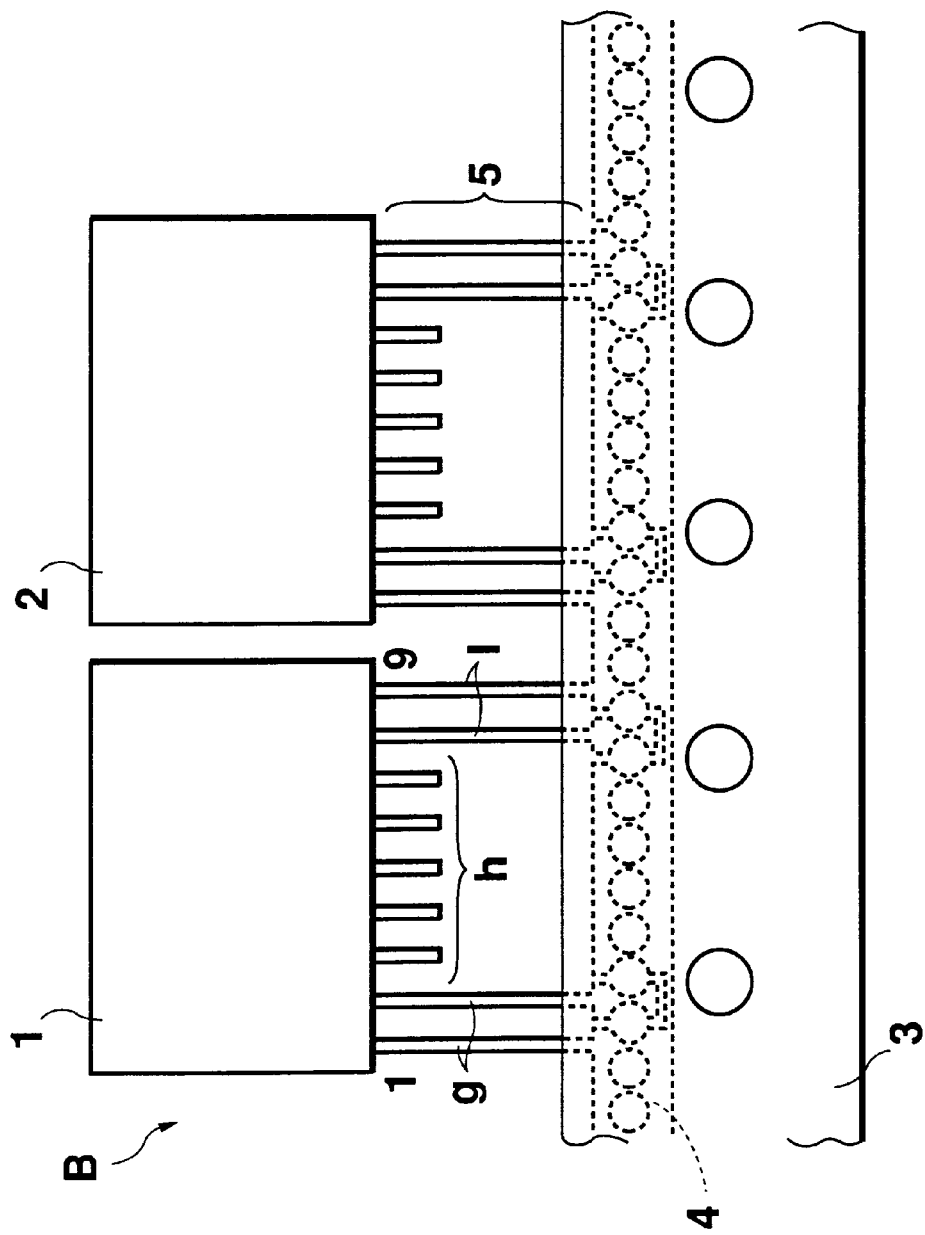
FIG. 3 is a view in profile showing taped electronic components and a taping method according to another example of the present invention.

In a taped electronic component B of Example 2, as shown in FIG. 3, a lead frame 5 comprising leads g, h, i and tie-bars 4 are attached to hybrid ICs 1, 2, and each tie-bar is taped with the tape 3. In the case of this taped electronic component B, the inner leads are short. Further, the two leads and tie-bars on both edges of the hybrid IC are separate from the other tie-bars. This is because pins 1 and 9 in the figure are either common or non-connected so that electric current can be passed through the component in order to check its operation.

The taping of the aforesaid electronic component B is carried out as follows. After forming the lead frame 5 in a one-piece construction from the leads and tie-bars 4, the leads are attached to the hybrid IC by soldering. The inner leads are then cut by a press or the like to the length shown by h in FIG. 3. The gap separating the two leads and tie-bars on both edges of the hybrid IC is formed at the same time as the inner leads are cut. The tie-bars 4 are then taped in position with the tape 3.

In this Example 2, the leads are not cut off from the tie-bars and taped one by one as in the previous Example, so the taping provides stronger support. In addition, there are no positioning errors with the guide holes of the tape 3.

Next, in the taping method of Example 3, the arrangement is substantially the same as in Example 2, however as shown in Example 4, holes are provided in a tie-bar 6 and these holes are arranged to coincide with holes provided in the tape.

The holes provided in the tie-bar are provided when the lead frame is formed. The holes in the tape can be provided before or after holding the tie-bar of the lead frame by taping.

When the holes in the tape are provided before holding the tie-bar of the lead frame by taping, the holes in said tie-bar are made to coincide with the holes in the tape upon holding the tie-bar in position by taping together.

There are initially no holes in the tape, and holes are then formed at the same position as the holes in the tie-bar of the lead frame.

Figure 4:
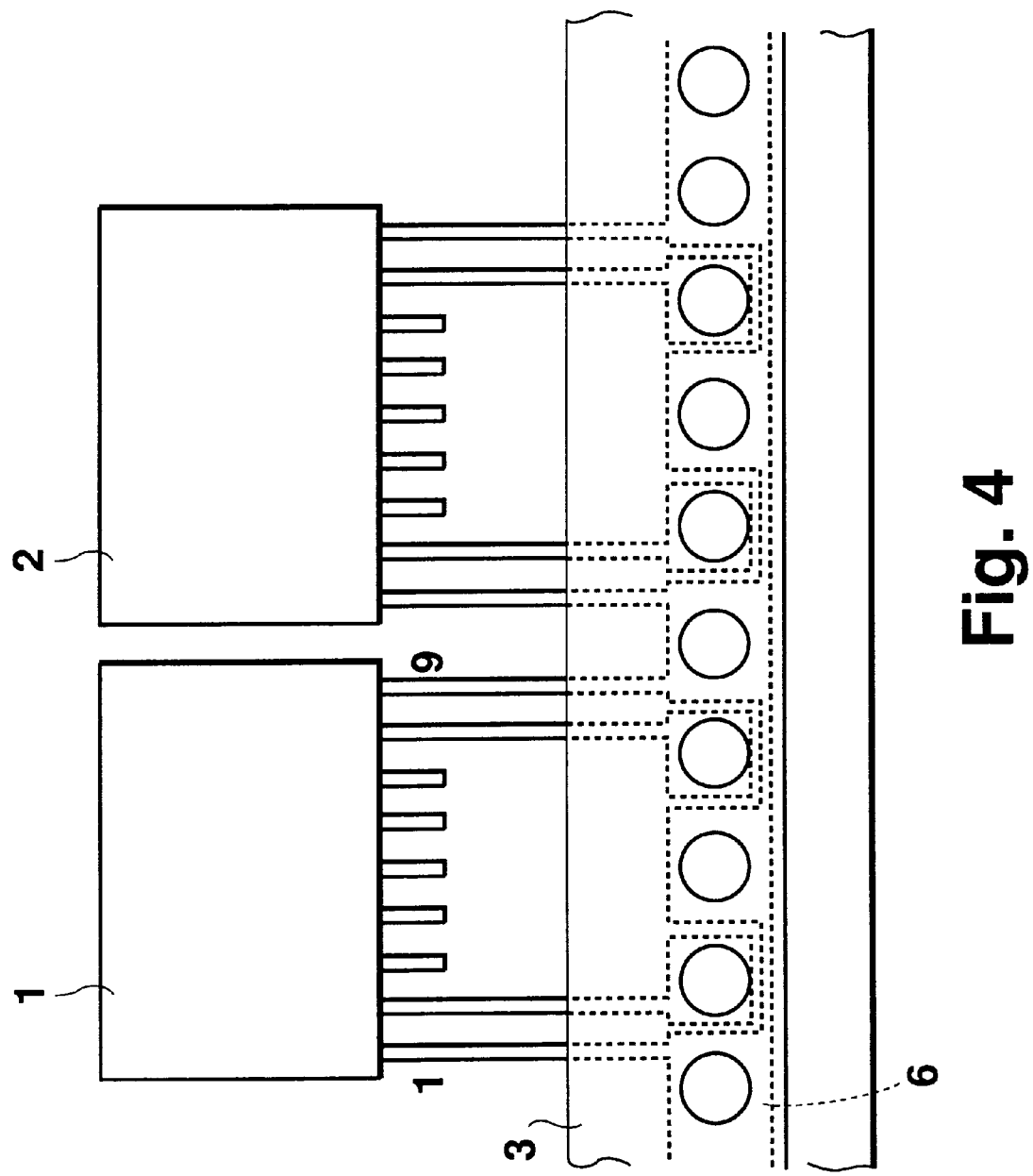
FIG. 4 is a view in profile showing taped electronic components and a taping method according to another example of the present invention.

In this Example, there is no positioning error between the ICs and the holes in the tape. The ICs can therefore be supplied to the mounter with extremely high precision, and the mounter grasps each IC accurately so that it can be mounted on the printed board. In FIG. 4, the two leads and tie-bars on both edges of the hybrid IC are separate from the other tie-bars in order to allow checking of the operation of the component as in FIG. 3.

According to this invention, the leads on both edges of electronic components are taped in position so that sideways motion and twisting of components to be positioned are prevented.

Further, by supporting the electronic components at each tie-bar, a plurality of components can be accurately positioned at predetermined intervals and positioning errors can be prevented. The components can therefore be mounted accurately.

What is claimed:

1. Taped electronic components comprising:

(a) a plurality of electronic components;
   (b) a plurality of lead groups attached to respective ones of said electronic components, wherein each lead group has a plurality of leads, and wherein the outermost leads of the lead group of each component are longer than the remaining leads of such lead group; and
   (c) a tape for taping said outermost leads together to fix them in position; and
   wherein each lead group attached to respective ones of said plurality of electronic components is composed of nine leads sequentially arranged in parallel with each other, wherein the first, second, eighth and ninth leads of each lead group are fixed together by said tape.

2. Taped electronic components comprising:

(a) a plurality of electronic components, each having a lead .group formed by a plurality of leads wherein the outermost leads of each lead group are longer than the remaining leads in such lead group;
   (b) a lead frame coupled to said plurality of electronic components, comprising a tie-bar extending along the outermost leads of each lead group of the plurality of electronic components; and
   (c) a tape affixed to said tie-bar, for fixing the outermost leads of each lead group of the plurality of electronic components in position.

3. Taped electronic components as recited in claim 2, said tie-bar comprising a plurality of holes and said tape comprising a plurality of holes coincident with said holes of said tie-bar when said tape is affixed to said tie-bar.

4. The taped electronic components of claim 2, wherein said tie-bar has a belt-like shape.

* * * * *